(12) United States Patent
Kok et al.

(10) Patent No.: US 8,080,366 B2
(45) Date of Patent: *Dec. 20, 2011

(54) IN-LINE PROCESS FOR MAKING THIN FILM ELECTRONIC DEVICES

(75) Inventors: Ronaldus Joannes Cornelis Maria Kok, Eindhoven (NL); Marinus Franciscus Johannes Evers, Heeze (NL); Franciscus Cornelius Dings, Veldhoven (NL)

(73) Assignee: OTB Solar B.V., Eindhoven (NL)

( * ) Notice: Subject to any disclaimer, the term of this patent is extended or adjusted under 35 U.S.C. 154(b) by 1305 days.

This patent is subject to a terminal disclaimer.

(21) Appl. No.: 11/709,785

(22) Filed: Feb. 23, 2007

(65) Prior Publication Data

US 2007/0238054 A1    Oct. 11, 2007

Related U.S. Application Data

(63) Continuation-in-part of application No. PCT/EP2005/054157, filed on Aug. 25, 2005, and a continuation-in-part of application No. PCT/NL2005/000298, filed on Apr. 22, 2005.

(51) Int. Cl.
*G03F 7/20* (2006.01)

(52) U.S. Cl. ........ 430/314; 430/317; 430/318; 430/319; 430/321

(58) Field of Classification Search .......... None
See application file for complete search history.

(56) References Cited

U.S. PATENT DOCUMENTS

| | | | |
|---|---|---|---|
| 5,932,012 A | 8/1999 | Kawasumi et al. | |
| 6,165,658 A | 12/2000 | Taff et al. | |
| 6,277,199 B1 | 8/2001 | Lei et al. | |
| 6,517,303 B1 | 2/2003 | White et al. | |
| 7,354,845 B2 * | 4/2008 | Kok et al. | 438/458 |
| 2001/0011526 A1 | 8/2001 | Doering et al. | |
| 2001/0015074 A1 | 8/2001 | Hosokawa | |
| 2001/0049197 A1 | 12/2001 | Yamazaki et al. | |
| 2002/0004261 A1 | 1/2002 | Asami et al. | |
| 2003/0228543 A1 | 12/2003 | Fujii et al. | |
| 2004/0055537 A1 | 3/2004 | Kurita et al. | |
| 2004/0141832 A1 | 7/2004 | Jang et al. | |
| 2004/0147066 A1 * | 7/2004 | Yamazaki et al. | 438/151 |
| 2004/0151562 A1 | 8/2004 | Hofmeister et al. | |

FOREIGN PATENT DOCUMENTS

| | | |
|---|---|---|
| EP | 0930641 | 7/1999 |
| EP | 1172843 | 1/2002 |
| EP | 1223615 | 7/2002 |
| GB | 2350321 | 11/2000 |
| JP | 9-293888 A | 11/1997 |
| JP | 2003-126760 | 5/2003 |
| WO | WO-02/098573 | 12/2002 |
| WO | WO-2004/010480 | 1/2004 |

* cited by examiner

*Primary Examiner* — John A. McPherson

(74) *Attorney, Agent, or Firm* — David P. Owen; Coraline J. Haitjema; Hoyng Monegier LLP

(57) ABSTRACT

An in-line process for making a thin film electronic device on a substrate is described comprising the steps of: a) depositing a structurable layer onto a substrate; b) depositing a patternable material onto the structurable layer in a first pattern; and c) etching the structurable layer in areas uncovered by the patternable material. The steps are carried out without intermediate exposure of the substrate to ambient air.

30 Claims, 7 Drawing Sheets

IN-LINE PROCESS FOR MAKING THIN FILM ELECTRONIC DEVICES

CROSS REFERENCE TO RELATED APPLICATIONS

This application is a continuation in part of international application no. PCT/EP2005/054157, filed Aug. 25, 2005 and of international application number PCT/NL2005/000298, filed Apr. 22, 2005 which were published under PCT Article 21(2) in English. The contents of both applications are incorporated by reference herein in their entirety.

TECHNICAL FIELD

The present invention relates to an in-line process for making a thin film electronic device on a substrate. In a preferred embodiment the thin film electronic device is a thin film transistor. In a still more preferred embodiment, this process is integrated in and in-line process for making flat panel displays.

BACKGROUND ART

There is a growing market for flat panel displays in a wide variety of uses. Small flat panel displays are used in, for example, mobile phones and digital cameras. Larger panels are used as screens in laptop computers. Still larger panels, having a diagonal dimension of for example 13 or 17 inches, are becoming very popular as monitors for desktop personal computers. Still larger panels are being used increasingly in television receivers.

In its essence, a flat panel display comprises an array of pixels on a substrate. The pixels may comprise liquid crystals, or organic light emitting diodes, or OLEDs. In both cases a picture is formed by selectively activating pixels within the grid. The picture quality and resolution is determined to a large extent by the level of sophistication of the system for driving the pixels.

The segment drive method is designed to apply a voltage to discrete groups of pixels at the same time. This method is suitable for simple displays such as those in calculators, but are unsuitable for more sophisticated displays because of their relatively poor resolution.

For higher resolution displays a form of matrix drive method is required. Two types of drive method are used for matrix displays. In the static, or direct, drive method each pixel is individually wired to a driver. This is a simple driving method, but as the number of pixels is increased the wiring becomes very complex. An alternative method is the multiplex method, in which the pixels are arranged and wired in a matrix format. There are two types of matrix format, passive matrix and active matrix.

In passive matrix displays there are no switching devices, and each pixel is activated more than one frame time. The effective voltage applied to the pixel must average the signal pulses over several frame times, which results in a slow response time and a reduction of the maximum contrast ratio. The addressing of a passive matrix display also results in cross-talk that produces blurred images, because non-selected pixels are driven through a secondary signal voltage path.

In-active matrix displays a switching device and a combined storage capacitor can be integrated at each cross point of the electrodes, such that each pixel has at least one switching device. Active matrix displays have no inherent limitation in the number of scan lines, and present fewer cross-talk issues. Most active matrix displays use switching devices that are transistors made of deposited thin films, known as thin film transistors or TFTs.

An essential part of any TFT is a thin layer of semi-conducting material. A suitable semiconducting material is doped silicon. If doped silicon is used, it is usually in the form of amorphous silicon (a-Si). Amorphous silicon TFTs can be made in large area fabrication at a relatively low temperature (300 to 400 degrees C.).

Poly-crystalline silicon (p-Si) or microcrystalline silicon (mc-Si) is superior to amorphous silicon in that It has an electron mobility that is 1 or 2 orders of magnitude greater than that of amorphous silicon. However, polycrystalline and microcrystalline silicon are costly to make and especially difficult to fabricate when manufacturing large area displays.

The creation of a TFT requires a significant number of individual process steps, each of which needs to be carried out in a vacuum or a controlled atmosphere in order to avoid contamination. Even small amounts of contamination may seriously hamper or even destroy the functionality of the TFT. The creation of a flat panel display requires additional steps of depositing materials, such as the display materials themselves and encapsulation layers protecting the TFTs and display materials from ambient influences.

The current practice is to conduct these individual process steps in separate, dedicated machines. This requires that all individual machines necessary for manufacturing a flat panel display be assembled in a clean room, and that the substrates be moved from one machine to the next. Manufacturing logistics often require that substrates be stored for some length of time in-between process steps. To avoid contamination, this storage also needs to take place in a clean room environment.

Manufacturers of flat panel displays have sought to overcome the inherent cost of these manufacturing processes by using large substrate panels upon which several flat panel displays can be manufactured at one time. Although this approach allows for a certain economy of scale, it requires the handling of ever larger substrate panels with the accompanying cost of requiring increasingly costly equipment for carrying out the steps of the manufacturing process, and for conveying the substrate panels from one process step to the next.

DISCLOSURE OF THE INVENTION

It is, therefore, an object of the present invention to provide an in-line process for the manufacture of thin film transistors on a substrate. It is a further object of the present invention to integrate the in-line process for manufacturing thin film transistors into an in-line process for manufacturing flat panel displays.

In a first embodiment the invention relates to an in-line process for making a thin film electronic device on a substrate, comprising the steps of:
a) depositing a structurable layer onto a substrate;
b) depositing a patternable material onto the structurable layer in a first pattern; and
c) etching the structurable layer in areas uncovered by the patternable material;
said steps being carried out without intermediate exposure of the substrate to ambient air.

The first pattern in which the patternable material is deposited can be a layer fully covering the structurable layer. This full layer may be subsequently developed into a second pattern, for example by covering the layer with a mask, and curing the exposed areas of the patternable layer by, for example irradiation.

In an alternate embodiment the patternable material is deposited in a first pattern approximating said second pattern, and subsequently cured into the desired second pattern, which is inscribed within the first pattern. In a further embodiment, the second pattern may be formed by ablation of parts of the first pattern.

In a preferred embodiment the thin film electronic device is a thin film transistor.

In a further preferred embodiment the invention relates to a process for manufacturing a flat panel display incorporating the in-line process for making thin film transistors on a substrate, whereby the TFTs are formed on the substrate arranged in a pixel pattern, and the formation of the thin film transistors is followed by the steps of:
d) placing discrete particles of OLED material onto the substrate, said particles being associated with said pixels;
e) placing a cathode on top of the OLED particles to form an OLED device;
f) encapsulating the OLED.

Instead of an OLED material, liquid crystals between two glass plates may be deposited onto the TFTs.

The term "in-line process", as used herein, means a process comprising several process steps that need to be carried out in a vacuum or in a controlled atmosphere, whereby these process steps are carried out in interconnected process stations, such that the substrate is not exposed to ambient air during or in-between process steps. A preferred thin film electronic device is a thin film transistor.

The term "substrate" in this context is intended to encompass known glass and silicon substrates as well as polymer substrates and other suitable materials on which the inline process of the invention may be performed.

Preferably, the in-line process is continuous in the sense that subsequent process steps follow one another without intermediate storage of the substrate, other than small buffers for short-term storage.

The term "ambient air" as used herein means air suitable for the breathing needs of human beings. As such the term encompasses outside air, conditioned air as may be found inside a building, and conditioned and purified air as may be found in a clean room.

The structurable layer may be an insulating layer, a metal layer, a layer of a transparent conducting oxide (TCO), a semiconducting layer or any other layer that may be suitably structured to form part of the thin film electronic device. A preferred semiconducting material for the structurable layer is doped silicon.

The structurable layer may be deposited using an evaporation process, preferably a plasma-enhanced chemical vapor deposition (PECVD) process, or a sputtering process.

The term "etching" is intended to mean any appropriate technique for removing material or otherwise changing its properties.

The term "patternable layer" is intended to mean any layer that may be applied or formed on the structurable layer and that may form a pattern or may be treated to cause a pattern to be formed. A preferred form of patternable material is photoresist material that may be cured e.g. by exposure to light and then developed. Other forms of patterning are also known e.g. where part of an active layer is removed by laser ablation. Such a process is known from the unpublished PCT application PCT/IL2004/000792, the contents of which are hereby incorporated by reference in their entirety. Further alternative processes that permit a fine pattern to be formed in a layer may also be used, In particular, surface energy patterning techniques and other modifications of the surface properties of the patternable layer e.g. under influence of illumination The patternable material is used for selectively covering the structurable layer, so that this layer may be structured by, for example, by etching away the exposed portions of the structurable layer. To this end the patternable material may be deposited in a first pattern, and subsequently selectively cured in a second pattern, inscribed within the first pattern. In this context, the term "cured" is intended to cover any process that may distinguish the properties of part of the patternable layer and encompasses conventional negative and positive photoresist and also laser ablation techniques for forming the second pattern.

The first pattern may be a full layer, completely covering the structurable layer. Any known technique may be used for depositing the layer of patternable material. For use with photoresist material, curing of selected areas of this layer may be done by irradiation through a mask. Uncured photoresist material is then removed in a developing process, resulting in the desired second pattern.

Selective patterning of the patternable material may also be accomplished using a direct imaging technique.

In a preferred embodiment the first pattern is not a full layer, but approximates the desired structure of the structurable layer. The patternable material is selectively removed to form the desired second pattern. It will be clear that the first pattern must be such that the second pattern can be inscribed within the first pattern.

A preferred technique for depositing the patternable material in a first pattern that is less than a full layer is a printing technique, whereby the patternable material is deposited using a printhead. Advantages of such a technique is that less patternable material is used, and less patternable material needs to be removed in the following step.

In a preferred embodiment the patternable material is deposited and cured using an integrated printhead/cure head assembly. Such an assembly may sometimes be referred to as a processing head. In this manner, both the delivery of patternable material and its subsequent curing can be realized in one movement of the processing head with respect to the substrate. The position of the cure head may be, moreover, directly mechanically coupled to the position of the printhead. As a result, after the application of the patternable material, its location can be determined with great accuracy and the curing process can be easily directed by reference to this location. The direct coupling of the position of the print head with the cure head practically excludes the possibility of the cure head carrying out a curing operation at incorrect positions on the substrate. With a localised curing step, any relatively inaccurate outlines of the patternable material applied by the printer can be more easily "cut off", so that cured structures with fine, sharp boundaries are obtained.

Even more preferably the assembly also comprises a scan head According to a further elaboration of the invention, a scanning step can be carried out immediately prior to the printing step by a first scan head provided on the processing head on an upstream side of the printhead, viewed in the relative direction of movement of the processing head with respect to the substrate.

With such a scanning step, it can be determined where the already applied structures are located on the substrate, so that directly after the scanning step the printing step can proceed to apply new structures accurately positioned with respect to the structures already present on the substrate.

Alternatively or additionally, it would be advantageous to immediately check the applied and cured structure, for instance to determine whether the patternable material has been correctly applied. For this purpose, according to a further elaboration of the invention, a scanning step can be carried out immediately after the printing step e.g. by a second scan head provided on the processing head on a downstream side of the printhead, viewed in the relative direction of movement of the processing head with respect to the substrate. Using information obtained from the second scan head, it can be determined whether printing has correctly taken place and, if this is not the case, the patternable material can still be applied at the desired positions in a second printing step. For this purpose, the head can go through a forward and backward movement over the same area of the substrate. Should it be detected during the second scanning movement that for some areas the patternable material has not yet been applied, it can still be deposited and cured in those areas in the backward movement.

According to an aspect of the invention, a scanning step is carried out immediately prior to the cure step in that a first scan head is provided on the processing head on the upstream side of the cure head, viewed in the relative direction of movement of the processing head with respect to the substrate.

In this manner, in one movement of the processing head with respect to the substrate, it can be determined where the applied patternable material is to be cured, while the curing can be carried out in the same movement of the processing head. It is then also advantageous according to the invention if a scanning step is carried out immediately after the curing step e.g. by a second scan head provided on the processing head on the downstream side of the cure head, viewed in the relative direction of movement of the processing head with respect to the substrate. Thus, using the information obtained with the second scan head, it can determined whether curing has taken place where it should have and, if this is not the case, the patternable material may still be cured at the desired positions in a second curing step. Also in this case, for this purpose, the head can go through a forward and a backward movement over the same area of the substrate. If it is detected with the second scan head that the patternable material has not yet been cured in some areas, it can still be cured in those areas in the backward movement.

The in-line process of the present invention preferably is a continuous process. More preferably the process comprises in-line quality checks, and feedback loops for adjusting selected process parameters based on these in-line quality checks.

In addition to the process steps described hereinabove the process optionally comprises process steps selected from the group of a washing step; a pre-bake step of the patternable layer; a post-bake step of the patternable layer; a structured layer annealing step; and combinations thereof.

The process for making a thin film electronic device may be incorporated in a process for making a flat panel display.

In a preferred embodiment the in-line process of the present invention is used for depositing onto a substrate thin film transistors that are arranged as pixels. Preferably this process is integrated with an in-line process for printing organic light emitting material in discrete areas associated with these pixels. Preferably this process is followed by an in-line process for providing a cathode to the organic light emitting material to form an OLED device, and for covering said OLED device with encapsulating layers.

It is desirable to create pixels capable of emitting light of different colors. This may be accomplished by combining in each pixel organic light emitting materials capable of emitting light of different colors. Another possibility is to provide an organic light emitting material emitting light of one color, preferably white, and providing color filters or a phosphorescing material.

The organic light emitting material may be deposited using an evaporation technique or a printing technique. The color filters and the phosphorescing material are preferably applied using a printing technique.

The process may comprise feedback loops based on in-line quality checks.

For the in-line process of this invention, it is desirable to use an assembly for processing substrates, which assembly comprises a vacuum load lock and at least one process chamber. In this context the term "vacuum" encompasses both an air pressure that is greatly reduced from atmospheric pressure, as well as controlled, specialized environments, such as carefully purified air and inert gases.

Desirably the assembly comprises a series of process chambers, each process chamber being dedicated to a specific process step. Preferably the assembly further comprises conveying means for conveying a substrate between neighbouring process chambers.

In a preferred embodiment the apparatus for performing the process of the present invention is modular, and comprises an in-line module for making thin film transistors on a substrate, an in-line module for printing light emitting material onto the substrate, and an in-line module for providing a cathode and encapsulating layers.

As desired, the apparatus may further comprise an in-line module for applying color filters, or an in-line module for applying phosphorescing material.

The various modules may be stand-alone modules, in which case they may be assembled in a common clean room. Preferably, the various modules are connected by connecting vacuum chambers, each connecting vacuum chamber having conveying means for conveying a substrate to a neighbouring module.

Preferably the assembly is provided with a conveying device for moving the substrates from a vacuum lock to a process chamber. Such an assembly is disclosed in published U.S. patent application U.S. 2004/0049308, the disclosures of which are incorporated herein by reference.

In a preferred embodiment the assembly comprises a number of process chambers, each dedicated to a specific process step. A conveying device is provided for moving the substrates from the vacuum lock to the first process chamber, and successively to subsequent process chambers. After completion of the final process step in the last process chamber, the substrate is moved to a vacuum lock from where it can be removed from the assembly. A preferred assembly is disclosed in Netherlands patent application number 102 4215, filed Sep. 3, 2003, the disclosures of which are incorporated herein by reference.

The in-line process of the present invention preferably comprises at least one step involving the deposition of silicon nitrides. It is desirable to use a source that is capable of depositing silicon nitrides at a high deposition speed, as otherwise such a process step could become the rate determining step for the entire in-line process. European patent number EP 0 297 637 discloses a plasma source that is capable of depositing silicon nitrides with deposition speeds on the order of tens of nm per second. This plasma source is particularly preferred for use in silicon nitride deposition steps of the in-line process of the present invention. The disclosures of European patent number EP 0 297 637 are incorporated herein by reference. A particularly preferred plasma source is disclosed in Netherlands patent application 102 3491, filed May 21, 2003, the disclosures of which are incorporated herein by reference.

BRIEF DESCRIPTION OF THE DRAWINGS

FIG. 1 compares the principles of a batch process for the manufacture of, for example, a TFT, with what could be considered a semi-batch process, and with the in-line process of the present invention. In the following, although the process in relation to a technique using a photoresist layer is described, it is intended that this be interpreted to apply equally to other patternable layers.

Figure 1:
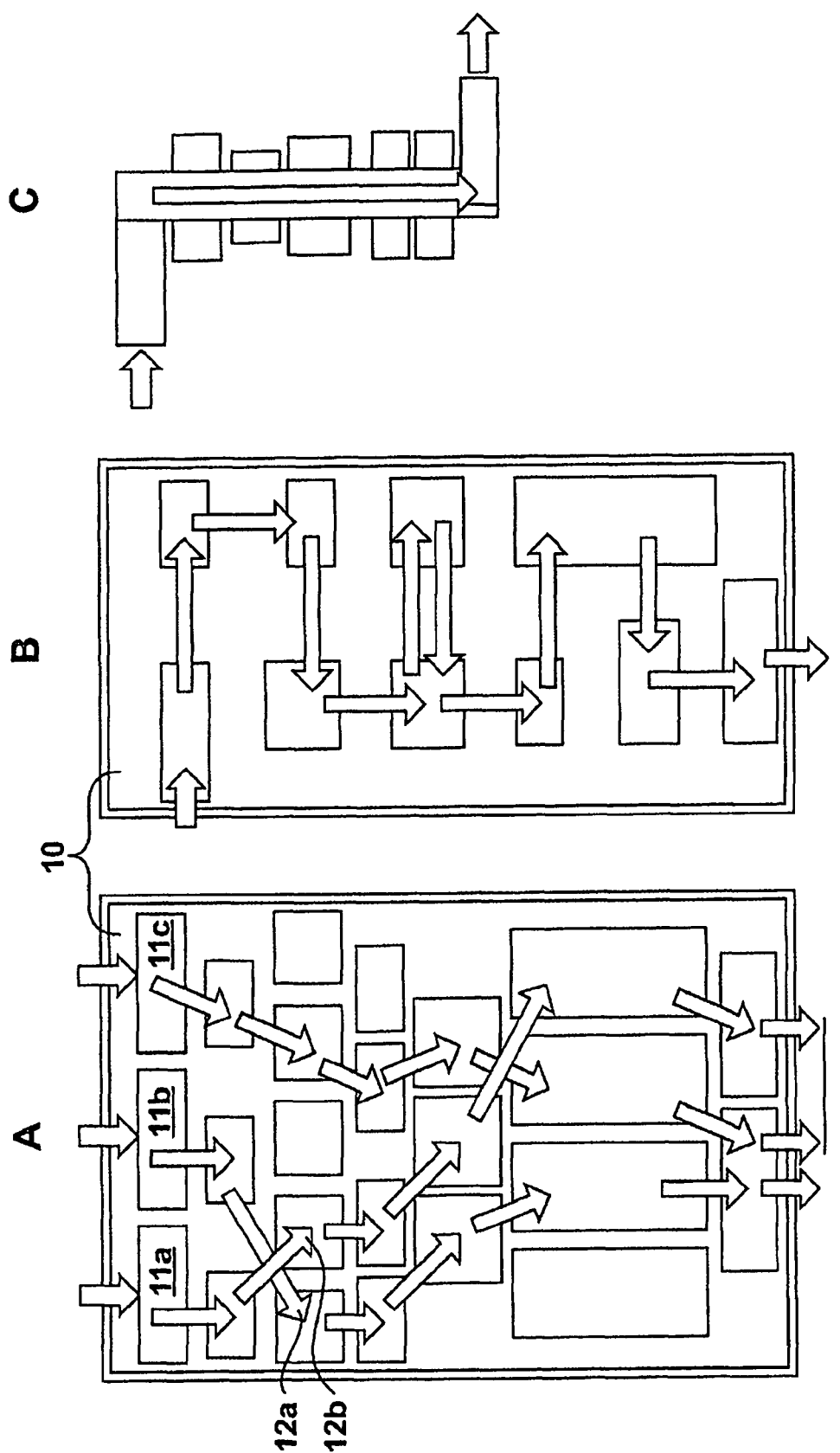
FIG. 1 is a schematic comparison of a batch process, a semi-batch process, and the in-line process of the present invention.

Section A of FIG. 1 is a schematic depiction of a batch process. The various steps of the manufacturing process are carried out in dedicated devices, each represented by a rectangular block. The devices are placed in a common clean room, 10. Devices 11a, 11b, and 11c, are identical, and may be operating simultaneously. The arrows depict, schematically, the flow of a product through the manufacturing process.

An important feature of the batch manufacturing process is the cross-over of product from one "assembly line" to another, as illustrated by crossing arrows 12a and 12b.

Another important feature is the presence of redundant capacity at certain stages of the manufacturing process, which is the result of the fact that the capacities of individual devices are not always attuned to each other. Also, the designers of batch processes may have a need for building spare capacity into their process in order to be able to deal with imbalances in the process logistics, and with occasional equipment breakdowns.

This feature of the batch process is illustrated by rectangular boxes that do not have incoming or outgoing arrows.

An aspect of the batch process is the use of batch wise loadlocking of the substrates, leading to variation in history before the substrates are processed.

Yet another feature of the batch process is the fact that product may need to be stored in clean room 10 for some length of time while waiting for a device dedicated to the next process step to become available. This feature is not shown in FIG. 1.

Section B of FIG. 1 shows what could be considered a "semi-batch" process. As in the batch process, dedicated devices depicted by rectangular boxes are placed together in a common clean room. In the semi-batch process there typically is one such device for each process step. The product flows from one device to the next, as shown by the arrows.

As in the batch process, product may have to be stored in the clean room for some length of time while waiting for the device for the next process step to become available. This is not shown in FIG. 1.

Section C of FIG. 1 shows schematically an in-line process according to the present invention. The rectangular boxes represent modules of an integrated manufacturing unit. The modules are interconnected, and the product is conveyed from one module to the next by a conveying means (not shown). A load-lock is integrated in the manufacturing unit. As the modules are interconnected, there is no need for the modules to be placed in a clean room environment. As the product is not exposed to an ambient environment in between process steps, the time lost in preparing the product for each subsequent process step is much reduced as compared to both the batch and the semi-batch processes.

The production capacities of the individual modules are attuned to one another, so that the amount of idle time between process steps is much reduced as compared to both the batch and the semi-batch processes.

Another advantage of the in-line process is that all substrates have the same process history, resulting in a much reduced product variability as compared to products made by a batch process or a semi-batch process.

Figure 1A:
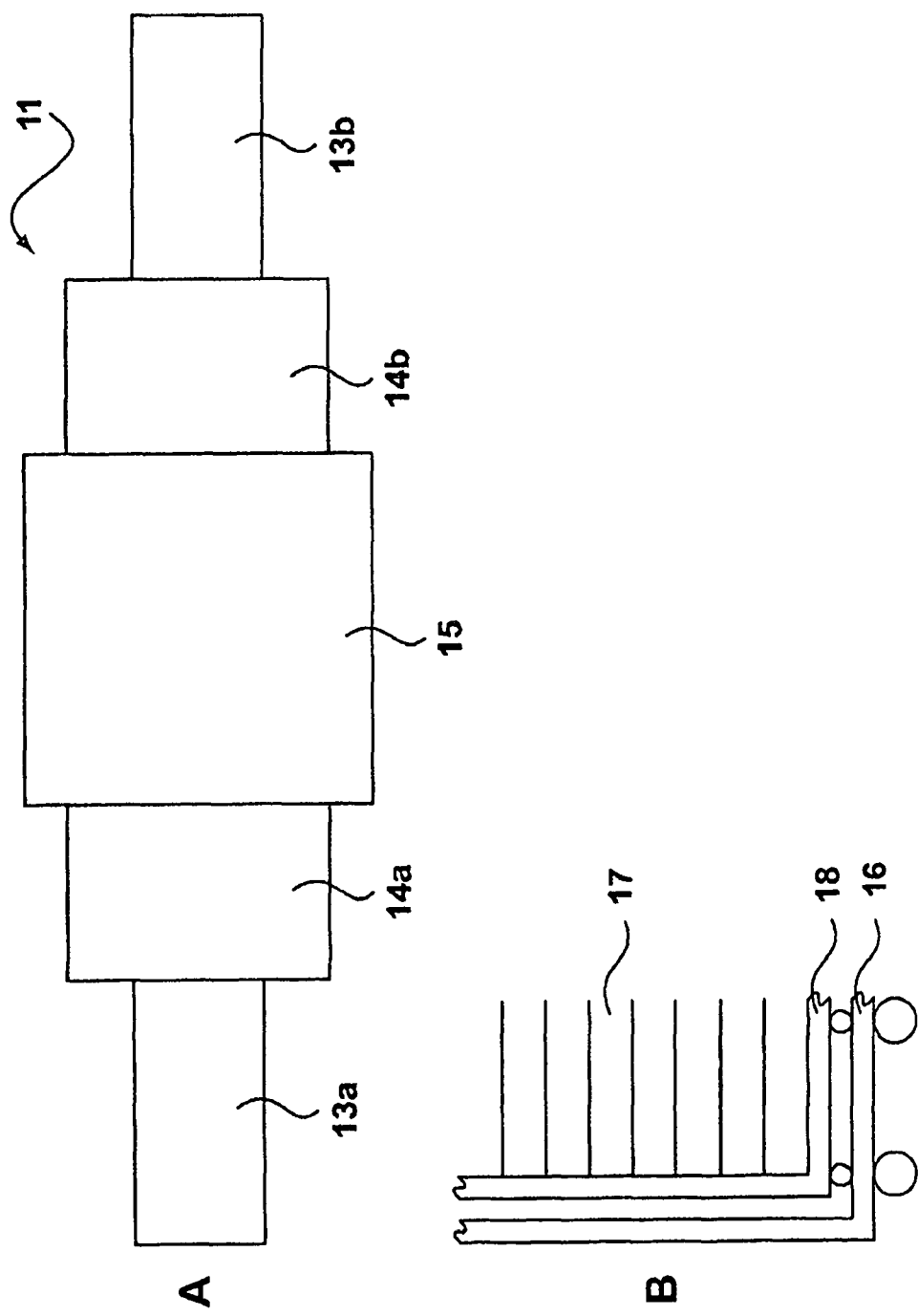
FIG. 1A is a more detailed representation of a process step station as may be used in a batch or semi-batch process.

FIG. 1A shows in more detail one of the modules 11a, 11b, 11c.

Module 11 comprises docking stations 13a, 13b; load locks 14a and 14b; and process chamber 15.

Portion b of FIG. 1A shows a so-called Automated Guide Vehicle (AGV) 16, which is used for transporting container 18, which holds a stack of substrates 17.

To subject the substrates 17 to the process of process chamber 15, AGV 16 is moved into docking station 13a, and from there into load lock 14a. In load lock 14a the substrates are pre-conditioned, and then moved one-by-one into process chamber 15 to undergo a specific process step. After each substrate has undergone the process step of process chamber 15 it is moved onto an AGV that is waiting in load lock 14b. After all the substrates have received the process step of process chamber 15 the AGV is moved from load lock 14b to docking station 13b, and from there into the clean room environment (not shown).

From this description it will be clear that this process results in each substrate having a different process history, as their respective dwell times in load locks 14a and 14b may vary widely.

The semi-batch process of section B of FIG. 1 uses similar modules, resulting in the same kind of variations in process history between individual substrates. These differences accumulate during the various process steps, and may result in significant differences in product quality, even among substrates of one batch.

Figure 2:
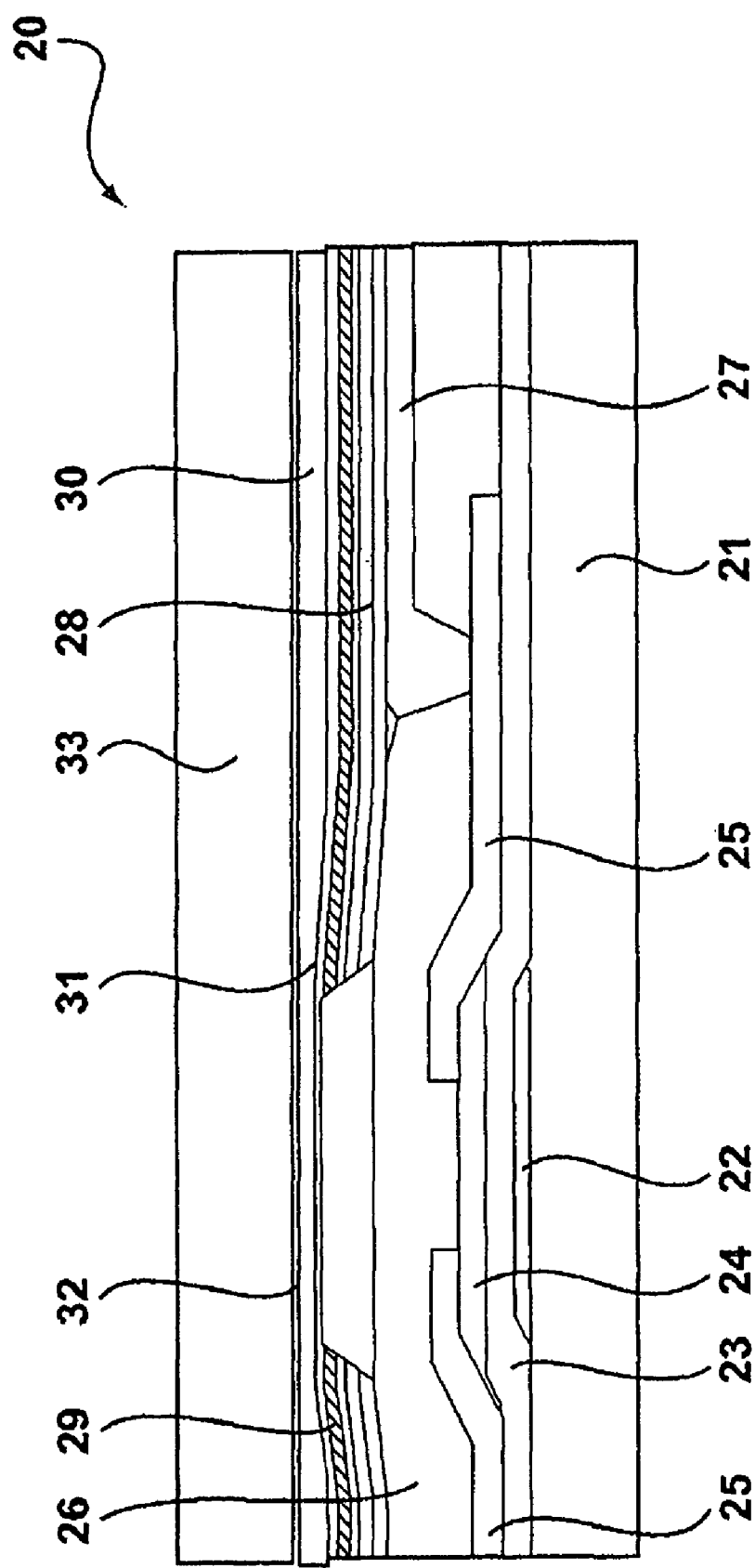
FIG. 2 is a schematic cross sectional view of a device manufactured by the process of the present invention.

FIG. 2 shows a cross section of a preferred light emitting device 20 suitable for use in the flat panel displays made by the process of the present invention. Substrate 21 can be any suitable substrate known in the art. The preferred substrate is transparent, for example a thin sheet of glass or a transparent polymer.

Deposited on the substrate 21 is a gate 22. A preferred gate composition is a sputtered layer of 100 to 500 nm thickness of a metal, TCO or combination of the two. The substrate and the gate are covered by a layer of silicon nitride 23. On top of the silicon nitride layer, immediately above the gate 22, is a layer of a semiconducting material 24. The semiconducting layer 24 may consist of doped versions of amorphous silicon, microcrystalline silicon, or a mixture of polycrystalline silicon and microcrystalline silicon. On top of the silicon nitride layer 23 is the source layer 25, in contact with the semiconducting layer. The source layer 25, which can be a sputtered layer of, for example, a metal like Al, Ag, Au, Mo, Cr, Ti, or an oxide like ZnO or a TCO, has an opening in the area of the semiconducting layer. On top of the entire structure is a planarizing layer 26. On top of planarizing layer 26 is anode 27, which penetrates through the planarizing layer so as to make electrical contact with source layer 25. The anode material may be any conductive material that can be easily deposited by known techniques. Preferably the anode is a light-reflecting layer of Al, Ag, Au, Mo, Cr, Ti, ZnO or TCO. Aluminum is specifically preferred.

Light emitting material 28 is deposited on top of anode 27. The light emitting material is preferably an organic light emitting material. The organic light emitting material may be a so-called "small molecule" (i.e., non-polymeric) material, or it may be a polymeric light emitting material. Examples of a small molecule material include fluorescent metal chelates, for example 8-hydroxyqulnoline aluminum (Alq3). Examples of polymeric materials include the conjugated polymers disclosed in U.S. Pat. No. 5,247,190, the disclosures of which are incorporated herein, by reference. Of these polymers, poly(p-phenylenevinylene) ("PPV") is particularly preferred.

Cathode 29 is positioned on top of the light emitting material 28, in the area immediately above the TFT. Shown in FIG. 2 also is blocking layer 30, which prevents light from reaching the TFT and influencing its operation. This blocking layer is optional.

Gate 22, silicon layer 24, source layer 25, planarizing layer 26, anode 27, and blocking layer 30, are structured layers.

The TFT, the anode, the cathode and the light emitting material form the functional part of the light emitting display device. The device is covered with a number of encapsulation layers to protect the device from the harmful influences of ambient oxygen and water vapor. On top of the encapsulation layer 31 is an adhesive layer 32, which forms a bond between the device and front glass layer 33. Having a glass substrate and a protecting front glass layer has the advantage that a stable symmetric structure is obtained.

Multiple variations are possible in the stack of thin layers used to make a light emitting device. The sequence may be varied, and layers can be added or removed depending on the specifics of the device to be produced.

Figure 3:
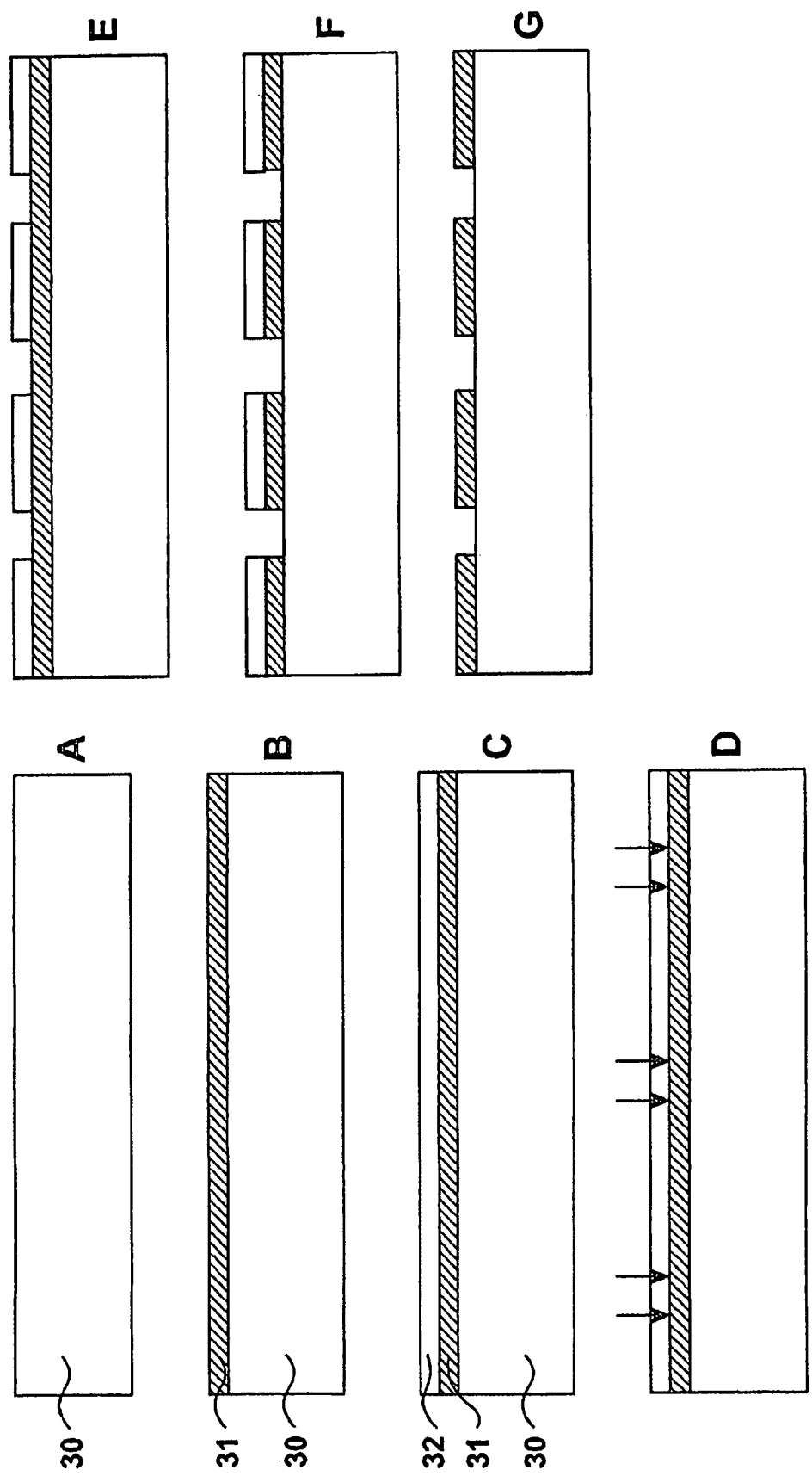
FIG. 3 is a schematic representation of the process steps for making a structured layer.

FIG. 3 is a schematic representation of the process for depositing an electronic device, such as a thin film transistor, onto a substrate. A glass substrate 30, shown in FIG. 3*a*, is covered with a structurable layer 31 (FIG. 3*b*), such as a doped silicon layer, using the plasma-enhanced chemical vapor deposition (PECVD) process disclosed in European patent number EP 0 297 637. The structurable layer is then coated with a photoresist material (32), in a first pattern. The first pattern shown is a full layer covering all of the structurable layer, but the first pattern may conveniently be less than a full layer, such as a rough approximation of the second pattern to be formed in a subsequent step.

In step d the photoresist coating (32) is exposed to a light source through a mask. The mask is designed to provide a second pattern, inscribed within the first pattern. The light source can be any source suitable for curing the photoresist material in the desired areas.

In a developing step the non-cured photoresist material is removed, resulting in the structurable layer being in discrete, predetermined areas. Exposed portions of the structurable layer are removed by etching (step c), resulting in a structure forming part of the required transistor. After the etching step the photoresist material is stripped off.

This process is repeated to form a complete transistor.

Figure 4:
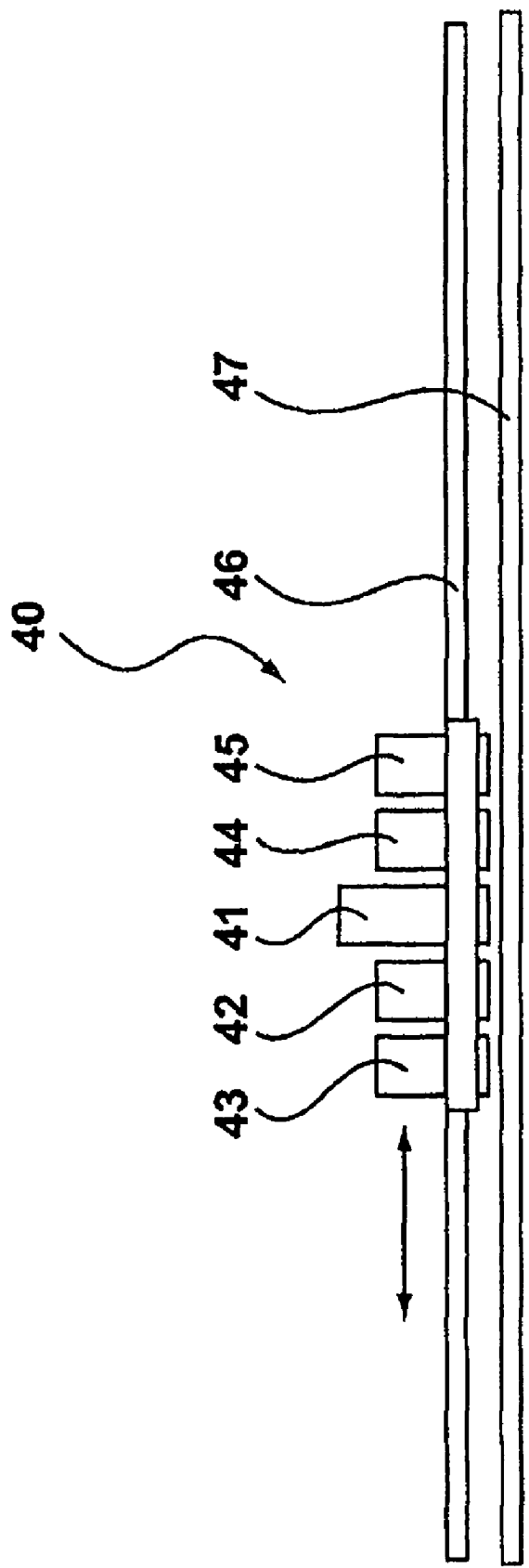
FIG. 4 is a schematic representation of an integrated printhead/cure head/scan head assembly.

The process described in FIG. 3 and the accompanying text utilizes the common approach of providing a full layer of photoresist material covering the entire working area of the substrate, followed by selective removal. In a preferred embodiment the thin film transistor structure is created by means of the integrated printing and curing head of FIG. 4. This integrated printing and curing head 40 comprises printhead 41, a first cure head 42, a first scan head 43, a second cure head 44, and a second scan head 45. The printhead assembly is attached to a movable frame 46, which provides movement in the X- and Y-directions above substrate 47.

The operation of the integrated printing and curing head 40 is described in further detail in Netherlands patent application NL 1026013, filed Apr. 23, 2004, the content of which is hereby incorporated by reference in its entirety. In a movement of the head 40 over the substrate 47, structures already applied to the substrate 47 can be detected by the scan heads 43, 45. Using the inkjet printhead 41, the patternable layer can be deposited on the substrate 47 at the desired moment, such that the position of the patternable layer is attuned to the positions of the previously applied structures. Furthermore, in the same movement, the patternable material can be cured directly using the cure heads 42, 44 while use can also be made of the positions of the already applied structures detected with the scan heads 43, 45. Because cure heads 42, 44 and scan heads 43, 55 are provided on both sides of the inkjet printhead 41, the steps of scanning, printing and curing can be carried out both in a forward and a backward movement. In addition, as a result of the double scan heads 43, 45, the printed and cured structure can be evaluated directly and, optionally, on the basis of the evaluation, a second printing, curing and scanning step can be performed for correcting possibly incomplete structures applied in the first printing and curing step. By combining the printing head 41 and the curing and scanning heads 42-45, the integrated printing and curing head makes it possible to fine-tune the curing pattern of the photoresist material without the need for e.g. aligning of a mask. As the operation of the printing and curing head is computer-controlled, any modifications to the required pattern can be simply made by reprogramming the computer, and do not require any hardware changes as would be necessary if a mask were used.

After the thin film transistor is formed, the required areas are filled in with a light emitting material, such as an organic light emitting display, or OLED, material. The preferred method of depositing the light emitting material is by using an ink jet print head. This technique is disclosed in detail in published patent application U.S. 2003/0218645, the disclosures of which are incorporated herein by reference.

Figure 5:
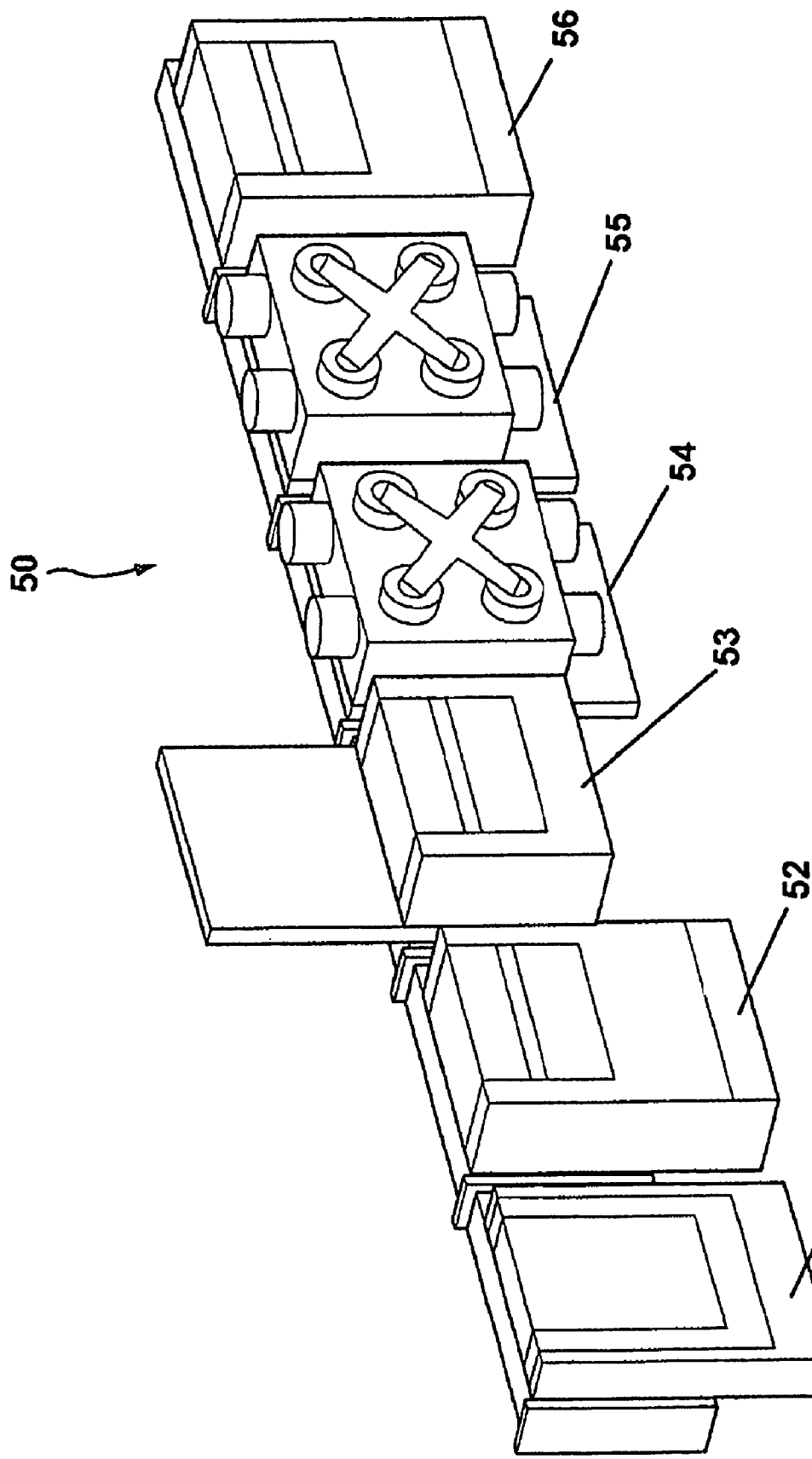
FIG. 5 shows part of a module for making depositing a structured layer on a substrate.

FIG. 5 is a schematic representation of an in-line module 50 for the manufacture of thin film transistors on a substrate. This is an assembly of the type described in Netherlands patent application 1024215, filed Sep. 3, 2003, the disclosures of which are incorporated herein by reference. A substrate is introduced into a load lock chamber (not shown). From the load lock chamber the substrate is moved through a series of process chambers by a conveying means (not shown). After conditioning of the substrate, the substrate is moved to process chamber 51, which is provided with a device for depositing a layer that has to be structured such as a metal layer, a TCO layer, a semiconducting layer or and insulating layer. The substrate is then moved to process chamber 52, which is provided with an integrated printing and curing head of the type described hereinabove. The deposited photoresist material is developed in process chamber 53. During this process any non-cured photoresist material is removed. This exposes discrete areas of the underlying layer to an etching step, which takes place in process chamber 54. The remaining photoresist material is removed in a stripping/ashing step in chamber 55. The substrate is then subjected to a cleaning step in chamber 56, which may be $CO_2$ snow cleaning. This module can be repeated several times as required for the device to be produced.

It will be understood that this module is itself modular, and that the in-line manufacturing process may be varied by substituting sputtering, ink-jet printing, or spin-coating modules for the depicted PECVD modules.

Figure 6:
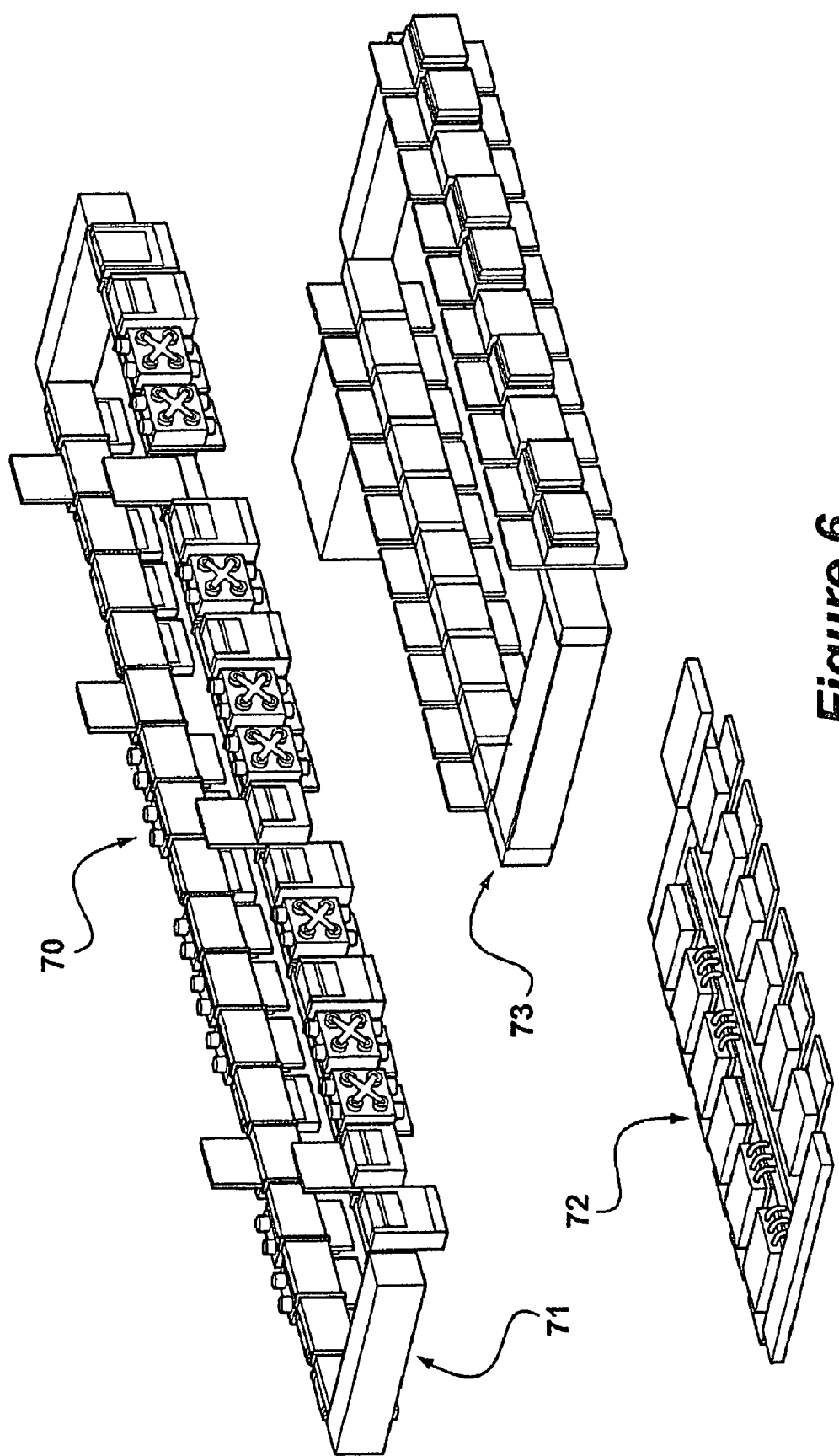
FIG. 6 shows a complete modular apparatus for making a flat screen display panel.

FIG. 6 shows the modular design of an in-line apparatus for the manufacture of the entire flat panel display. The first module 70 is the module for in-line formation of the thin film transistor, which is described in more detail hereinabove. As shown in FIG. 6, this module is executed with two rows of process chambers connected by a conveying chamber 71. This setup is sometimes preferred to save the floor space, but is otherwise functionally similar to the module shown in FIG. 5. The second module, 72, comprises a second series of process chambers and is dedicated to the in-line printing of the organic light emitting material. OLEDs emitting different colors of light may be printed close together so as to form a single pixel, or in the alternative light emitting material of one color may be printed in discrete areas or the entire area of the pixel, each provided with a color filter of a different color.

Module 73 has a third series of process chambers designed for providing the cathode material and the encapsulation layers, and, optionally, an adhesive layer and a front glass panel.

The three modules may be each freestanding, for example put together in a clean room environment. However, in a preferred embodiment of the present invention the three modules are interconnected by vacuum chambers and provided with conveying means for conveying a substrate from one module to the next.

The invention is not limited to the production of TFT structures for displays. The same method can be applied for the production of all kind of structured layers in electronic devices. One example is the production of a TCO or ITO layer of passive matrix displays. On a glass or polymer substrate an ITO layer is deposited by for example sputtering which layer is structured by depositing a photo resist layer on top of it, structuring the photo resist and etching the ITO layer.

Other examples of electronic devices that can be produced with the method of the invention are light emitting diodes, displays for signing, sensors, organic electronics, micro electronic mechanical systems (MEMS), optoelectronic devices, and structures in the production of microchips.

The invention claimed is:

1. An in-line process for making a thin film electronic device on a substrate, comprising the steps of: a) depositing a structurable layer onto a substrate; b) depositing a patternable material onto the structurable layer in a first pattern using an integrated processing head comprising a print head, a cure head and a scan head; and c) etching the structurable layer in areas uncovered by the patternable material; said steps being carried out without intermediate exposure of the substrate to ambient air.

2. The in-line process of claim 1, wherein the structurable layer is an insulating layer, a metal layer, a TCO layer or a semiconducting layer.

3. The in-line process according to claim 1, wherein the thin film electronic device is a thin film transistor.

4. The in-line process according to claim 1, wherein step a) comprises a plasma-enhanced chemical vapor deposition process.

5. The in-line process according to claim 1, wherein step a) comprises sputtering of a material selected from the group consisting of metals and TCO.

6. The in-line process according to claim 1, wherein step a) comprises evaporation of a material selected from the group consisting of metals and TCO.

7. The in-line process according to claim 1, wherein step b) comprises depositing the patternable material onto the structurable layer in a first pattern and selectively treating the patternable material to produce a second pattern within the first pattern.

8. The in-line process according to claim 7, wherein the step of depositing patternable material is followed by selectively curing the patternable material by irradiation using a mask.

9. The in-line process according to claim 7, wherein the step of depositing patternable material is followed by selectively curing the patternable material by irradiation using direct imaging.

10. The in-line process according to claim 1, wherein step b) comprises a scanning step to determine the location of existing structures on the substrate.

11. The in-line process of claim 1, wherein the step of depositing patternable material is integrated with a step of selectively curing said patternable material.

12. The in-line process of claim 1, wherein step b) comprises a scanning step to determine the correct deposition of the patternable material on the structurable layer.

13. The in-line process according to claim 1, which is a continuous process.

14. The in-line process according to claim 13, further comprising feedback loops based on in-line quality checks.

15. The in-line process according to claim 1, further comprising subsequently removing substantially all the patternable material.

16. The in-line process of claim 1, further comprising a process step selected from the group consisting of a washing step, a pre-bake step of the patternable material, a post-bake step of the patternable material, a step of annealing of the structured layer, and combinations thereof.

17. The in-line process according to claim 1 wherein patternable material is removed by laser ablation.

18. The in-line process according to claim 1, wherein the patternable material is a negative photoresist and the process further comprises developing the photoresist material.

19. The in-line process according to claim 1, wherein the patternable material is a positive photoresist and the process further comprises developing the photoresist material.

20. The in-line process according to claim 1, wherein the patternable material is responsive to surface energy.

21. The in-line process according to claim 1, wherein the patternable material is an ablatable lacquer.

22. An in-line process for the manufacture of a flat panel display, incorporating the in-line process of claim 1.

23. The in-line process according to claim 1 comprising:
a) an in-line process for making thin film transistors on a substrate, said thin film transistors being arranged as pixels;
b) an in-line process for printing organic light emitting material in discrete areas associated with said pixels; and
c) an in-line process for providing a cathode to the organic light emitting material to form an OLED device, and for covering said OLED device with encapsulation layers.

24. The in-line process of claim 23 wherein organic light emitting materials emitting light of different colors are combined to form a pixel.

25. The in-line process of claim 23 wherein organic light emitting material emitting light of one color is combined with color filters to form a pixel.

26. The in-line process of claim 23 wherein organic light emitting material emitting light of one color is combined with phosphorescing material to form a pixel.

27. The in-line process of claim 26 wherein the phosphorescing material is applied by using a printing technique.

28. The in-line process according to claim 23, wherein the organic light emitting material is deposited by using an evaporation technique.

29. The in-line process of claim 25 wherein the color filters are applied by using a printing technique.

30. The in-line process according to claim 23, further comprising a cathode deposition step.

* * * * *